(12) United States Patent
Degani et al.

(10) Patent No.: US 7,705,684 B2
(45) Date of Patent: Apr. 27, 2010

(54) TRANSISTOR AND ROUTING LAYOUT FOR A RADIO FREQUENCY INTEGRATED CMOS POWER AMPLIFIER DEVICE

(75) Inventors: Offir Degani, Haifa (IL); Mark Ruberto, Haifa (IL)

(73) Assignee: Intel Corporation, Santa Clara, CA (US)

( * ) Notice: Subject to any disclaimer, the term of this patent is extended or adjusted under 35 U.S.C. 154(b) by 12 days.

(21) Appl. No.: 12/164,219

(22) Filed: Jun. 30, 2008

(65) Prior Publication Data

US 2009/0322427 A1 Dec. 31, 2009

(51) Int. Cl.
*H03F 3/14* (2006.01)

(52) U.S. Cl. ........................................ 330/307; 330/295

(58) Field of Classification Search ......... 330/252–261, 330/124 R, 286, 53–54, 307
See application file for complete search history.

(56) References Cited

U.S. PATENT DOCUMENTS 7,425,869 B2 * 9/2008 Aoki et al. .................. 330/276
2008/0315954 A1 * 12/2008 Staszewski et al. ......... 330/295

OTHER PUBLICATIONS

Yen, Cheng-Chi et al., "A 0.25um 20dBm 2.4 GHz CMOS Power Amplifier With an Integrated Diode Linearizer", IEEE MWCL, vol. 13, No. 2, (Feb. 2003), pp. 45-47.
Sowlati, Tirdad et al., "A 2.4GHz 0.18um CMOS self biased Cascode Power Amplifier", IEEE JSSC, vol. 38, No. 8, (Aug. 2003), pp. 1318-1324.
Ding, Yongwang et al., "A CMOS High Efficiency +22 dBm Linear Power Amplifier", IEEE 2004 Custom Integrated circuits conference, (2004), pp. 557-560.
Oh, Hyoung-Seok et al., "A Fully Integrated +23dBm CMOS Triple Cascode Linear Power amplifier with Inner Parallel Power Control Scheme", IEEE RFIC, (2006).
Kang, Johgchan et al., "Highly Linear 0.18um CMOS Power Amplifier With deep n-well structure", JSSC, vol. 41, No. 5, (May 2006), pp. 1073-1080.
Palaskas, Yorgos et al., "A 5-GHz 20-dBm Power Amplifier with digitally assisted am-pm correction in a 90nm CMOS process", JSSC, vol. 41, No. 8, (Aug. 2006), pp. 1757-1763.
Eo, Yunseong et al., "A fully integrated 24-dBm CMOS Power amplifier for 802.11a WLAN applications", IEEE MWCL, vol. 14, No. 11, (Nov. 2004), pp. 504-506.

* cited by examiner

*Primary Examiner*—Robert Pascal
*Assistant Examiner*—Hieu P Nguyen
(74) *Attorney, Agent, or Firm*—Schwabe, Williamson & Wyatt, P.C.

(57) ABSTRACT

An integrated CMOS power amplifier system to improve amplifier performance, the integrated CMOS power amplifier system including a plurality of differential main amplifier cores, a plurality of ground pads, and a plurality of routes to connect the plurality of differential main amplifier cores to the plurality of ground pads. Each differential main amplifier core includes a pair of collocated main amplifier core transistors. Each ground pad is connected to a subset of the differential main amplifier cores. Embodiments of the integrated CMOS power amplifier system decrease parasitic inductance to ground and increase the transconductance and amplification of the integrated CMOS power amplifier system, thus improving performance.

15 Claims, 4 Drawing Sheets

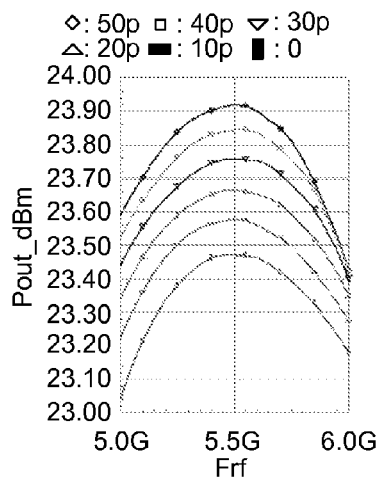 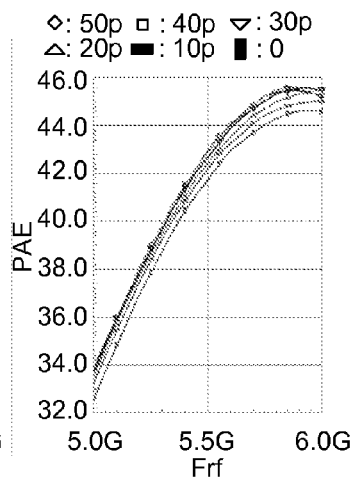 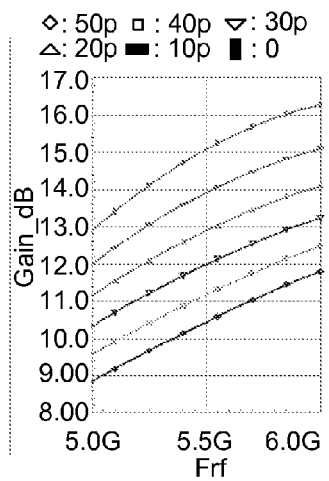
FIG. 4A  FIG. 4B  FIG. 4C
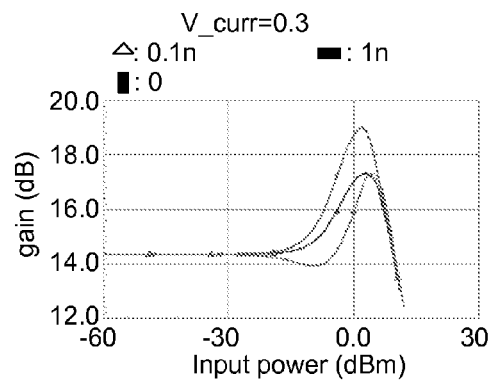 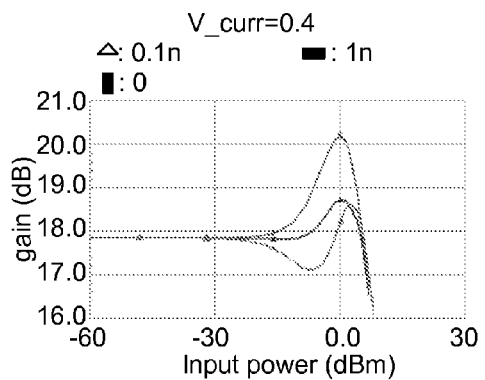
FIG. 5A  FIG. 5B
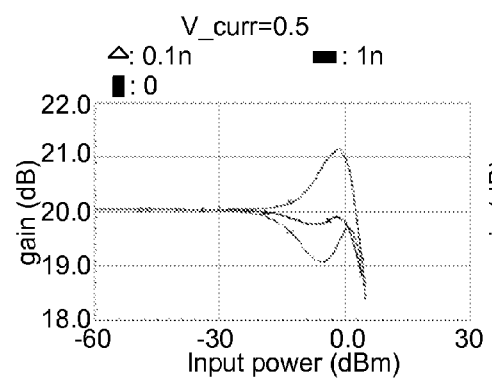 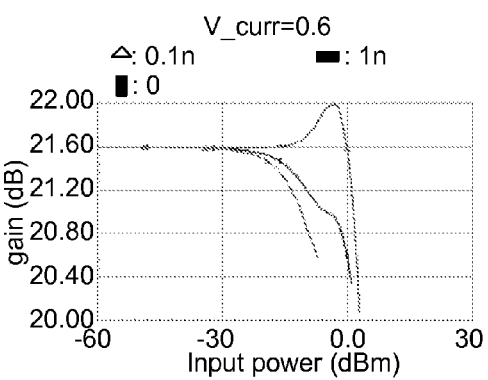
FIG. 5C  FIG. 5D

TRANSISTOR AND ROUTING LAYOUT FOR
A RADIO FREQUENCY INTEGRATED CMOS
POWER AMPLIFIER DEVICE

BACKGROUND OF THE INVENTION

Integration of radio frequency (RF) power amplifiers into complementary metal-oxide-semiconductor (CMOS) transceivers is one of the most challenging tasks in modern wireless communication products. Deep sub-micron CMOS technologies allow the integration of such power amplifiers on single-chip transceivers. An RF power amplifier is a circuit that amplifies an input RF signal while delivering significant amount of RF output power to a load. Today most wireless products employ an off-chip power amplifier, typically gallium-arsenide (GaAs) based, to provide the required power levels. However, integration of the power amplifier is driven by the ever shrinking design footprint of state of the art hand-held wireless products. Furthermore, implementing off-chip GaAs technology is more expensive than integrated CMOS power amplifier technology. Unlike the single-ended GaAs PAs, CMOS power amplifiers are typically differential amplifiers. Differential configurations reduce common mode spurious signals that evolve from coupling to the digital and LO circuits in a silicon RF Integrated Circuit (RFIC).

FIG. 1 depicts a conventional layout 100 of an integrated CMOS power amplifier 104 on a CMOS transceiver chip 102. The integrated CMOS power amplifier 104 includes shared ground pads 106, n-block common-gate transistors 108, a vd_n output voltage 110, p-block common-gate transistors 112, and a vd_p output voltage 114. The pair vd_n and vd_p create the output differential voltage and are shifted 180° from each other. The integrated CMOS power amplifier 104 also includes n-block common-source transistors 116, a vin_n input voltage 118, p-block common-source transistors 120, and a vin_p input voltage 122. The pair vin_n and vin_p 118 and 122 create the input differential voltage and are also shifted 180° from each other. A route, such as the vd_n output voltage 110 or the vin_p input voltage 122, is typically formed of one or more layers of metal formed on the surface of the CMOS transceiver chip 102, in-order to reduce the routing resistance and losses. The shared ground pads 106 connect to a single ground route 124.

The terms n-block and p-block do not respectively refer to a positive and negative aspect of the transistors, but rather, simply refer to their respective connections in relation to the "n" and "p" differential voltage terminals.

The drains of both the p-block and n-block common-gate transistors 108 and 112 are connected, respectively, to the vd_n and vd_p output voltage nodes 110 and 114. The sources of the p-block and n-block common-gate transistors 108 and 112 are connected, respectively, to the drains of the n-block and p-block common-source transistors 116 and 120. The gates of the n-block and p-block common-source transistors 116 and 120, which constitute the differential main amplifier core, are respectively connected to the vin_n and vin_p input voltage 118 and 122. The sources of each of n-block and p-block common-source transistors 116 and 120 are connected to the same single ground route 124 that connects to the plurality of shared ground pads 106.

In the conventional layout 100 of the integrated CMOS power amplifier 104, the n-block and p-block common-source transistors 116 and 120 are grouped together and placed consecutively across the integrated CMOS power amplifier 104. Other conventional layouts use similar arrangements.

The middle point on the ground route 124 is the differential virtual ground point. Thus, grouping the n-block common-source transistors 116 separately from the p-block common-source transistors 120 increases the distance to the average middle point virtual ground between the two sets of n-block and p-block common-source transistors 116 and 120. Consequently, increasing the path to the middle point virtual ground between the two sets of main core transistors increases the effective differential parasitic inductance to virtual ground which, in turn, adversely affects the performance and the gain of the integrated CMOS power amplifier 104. Moreover, the use of the shared ground route 124 to the shared ground pads 106, in combination with the increased length of the shared ground route 124 due to the grouped plurality of n-block and p-block common-source transistors 116 and 120 increases the common-mode ground inductance. This increased common-mode ground inductance also adversely affects the performance of the integrated CMOS power amplifier 104.

BRIEF DESCRIPTION OF THE DRAWINGS

FIGS. 4A-4C depict performance charts of a differential parasitic degeneration inductor.

FIGS. 5A-5D depict performance charts of a common-mode parasitic degeneration inductor.

Throughout the description, similar reference numbers may be used to identify similar elements.

DETAILED DESCRIPTION

Figure 2:
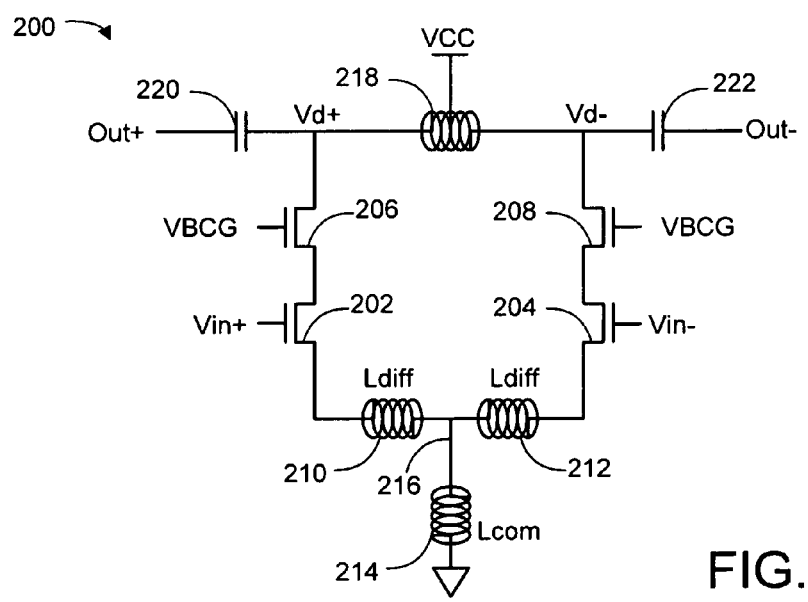
FIG. 2 depicts a schematic circuit diagram of one embodiment of a representation of a radio frequency integrated CMOS power amplifier.

FIG. 2 depicts a schematic circuit diagram of one embodiment of a simplified representation of a radio frequency integrated CMOS power amplifier 200. Although certain component parts are shown in conjunction with the radio frequency differential power amplifier 200 of FIG. 2, other embodiments may include fewer or more component parts, or equivalent parts, to perform fewer or more power amplifier functions. Additionally, while the components of the radio frequency differential power amplifier 200 are shown in FIG. 2 as being separate components, these components may be integrated on a single integrated chip. Additionally, some of the components shown may be representative of inherent circuit characteristics rather than discrete devices.

Figure 1:
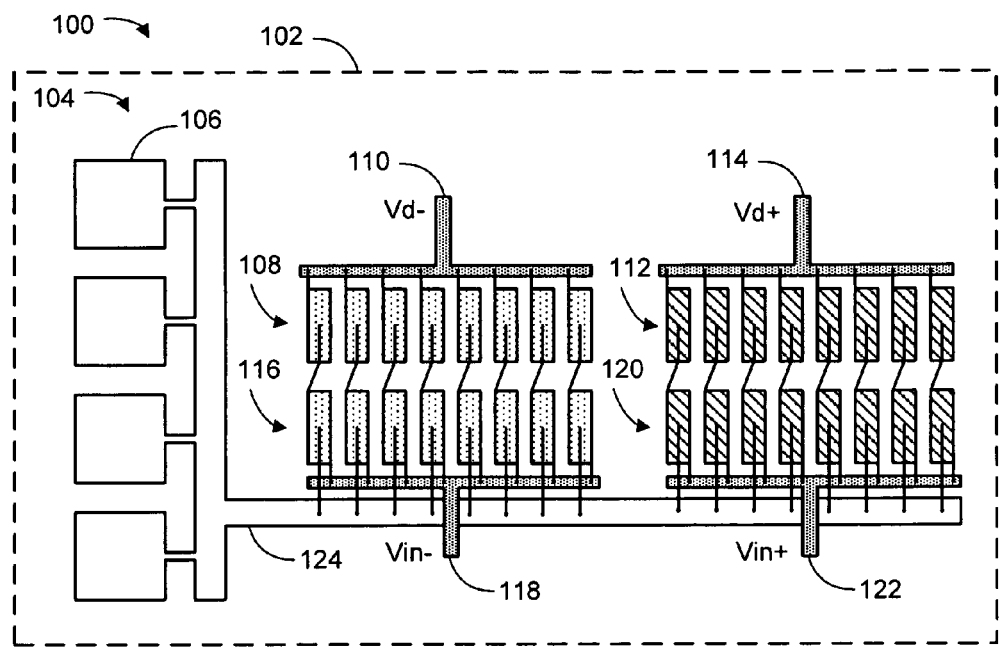
FIG. 1 depicts a conventional layout of an integrated CMOS power amplifier system.

The radio frequency differential power amplifier 200 includes a p-block common-source transistor 202, an n-block common-source transistor 204, a p-block common-gate transistor 206, and an n-block common-gate transistor 208. The p-block common-gate transistors 206 and n-block common-gate transistors 208 are connected to a voltage bias common-gate (VBCG). Individually, the common-source and common-gate transistors 202, 204, 206, and 208 of FIG. 2 may be similar to the transistors described above with reference to FIG. 1. In one embodiment, the common-source transistors 202 and 204 are thin gate transistors that, in CMOS technology, do not withstand high voltage swings, but produce a large transconductance (Gm) gain. For this reason, in one embodiment, the common-gate transistors 206 and 208 are thick-gate transistors that withstand most or all of the output swing and relax the voltage swing at the thin-gate transistor drains.

The depicted radio frequency differential power amplifier 200 also includes a p-block differential parasitic inductance 210 (Ldiff) to virtual ground and an n-block differential parasitic inductance 212 (Ldiff) to virtual ground. As the path between the common-source transistors 202 and 204 increases, the respective differential parasitic inductance to virtual ground increases.

The depicted radio frequency differential power amplifier 200 also includes a common-mode inductance 214 (Lcom). The radio frequency differential power amplifier 200, as depicted, illustrates a single shared path 216 to ground for both the common-source transistors 202 and 204.

The depicted radio frequency differential power amplifier 200 also includes a shunt inductor 218, a p-block series capacitor 220, and an n-block series capacitor 222. The shunt inductor 218, p-block series capacitor 220, and n-block series capacitor 222 are used to implement a matching network that converts the load impedance to a required impedance at the PA drain terminals according to the load-pull test.

Figure 3:
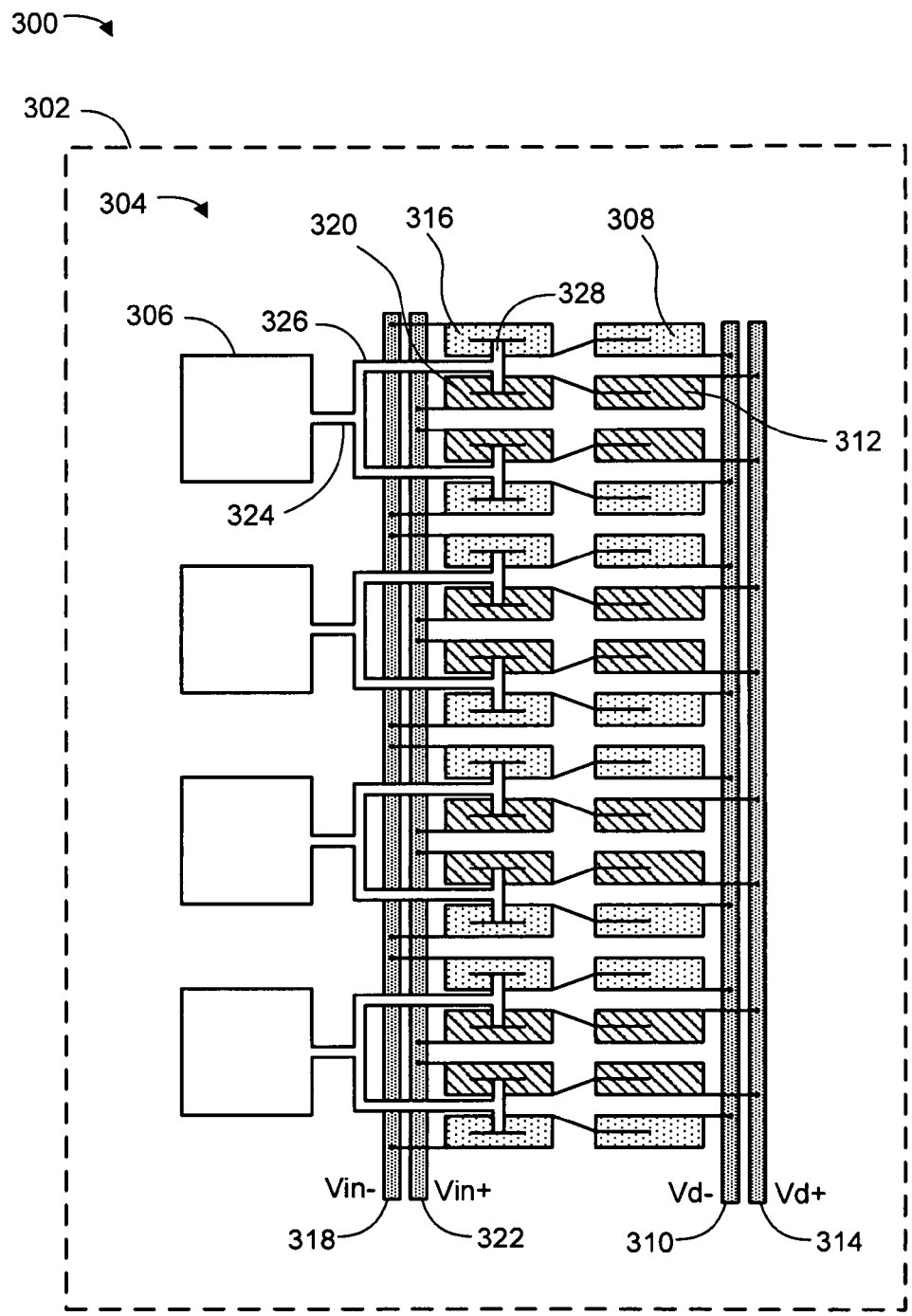
FIG. 3 depicts a schematic block diagram of one embodiment of an improved layout for an integrated CMOS power amplifier system.

FIG. 3 depicts a schematic block diagram of one embodiment of an improved layout 300 for an integrated CMOS power amplifier 304. Although certain component parts are shown in conjunction with the improved layout 300 of FIG. 3, other embodiments may include fewer or more component parts, or equivalent parts to improve the performance of the radio frequency differential power amplifier 200.

The improved layout 300 includes a CMOS transceiver package 302. In one embodiment, the CMOS transceiver package 302 is an integrated circuit that enables wireless communication. The CMOS transceiver package 302 includes an integrated CMOS power amplifier 304.

The integrated CMOS power amplifier 304 includes a plurality of ground pads 306, a plurality of n-block common-gate transistors 308, an n-block output voltage 310, a plurality of p-block common-gate transistors 312, a p-block output voltage 314. The integrated CMOS power amplifier 304 also includes a plurality of n-block common-source transistors 316, an n-block input voltage 318, a plurality of p-block common-source transistors 320, and a p-block input voltage 322. A route, such as the n-block output voltage 310 or the p-block input voltage 322, is one or more layers of an electrically conductive line that is formed on the surface of, or within, the CMOS transceiver package 302.

In one embodiment, each of the ground pads 306 enables a dedicated connection to ground to a select number, or subset, of the n-block and p-block common-source transistors 316 and 320 included in the integrated CMOS power amplifier 304. In some embodiments, the ground pads 306 include a plurality of bond wires. The plurality of bond wires connect the ground pads 306 to a ground plane on the CMOS transceiver package 302.

In one embodiment, each of the ground pads 306 include an independent route 324 connected to the n-block and p-block common-source transistors 316 and 320. As shown, each independent route 324 is bifurcated into a shared independent route 326. The shared independent route 326 includes a short parallel route 328 to connect a pair of differential common-source transistors 316 and 320. In one embodiment, the short parallel route 328 connects one of the p-block common-source transistors 320 to one of the n-block common-source transistors 316. The short route 328 allow the route between the p-block and n-block transistors 316 and 320 to be substantially short, thus minimizing the L differential 210 and 212 in FIG. 2.

In one embodiment, the improved layout 300 includes an alternating placement between the p-block common-source transistors 320 and the n-block common-source transistors 316. In other words, in some embodiments, the alternating placement of the common-source transistors 316 and 320 is parallel to a direction of a placement of the ground pads 306. In the improved layout 300, the direction of the placement of the ground pads 306 is from top to bottom on the drawing sheet. Furthermore, as depicted, the common-source transistors 316 and 320 are placed on the CMOS transceiver chip 302 in an ABBA pattern, where "A" represents the n-block common-source transistors 316 and "B" represents the p-block common-source transistors 320. In other words, one of the n-block common-source transistors 316 (A) is arranged at the top of the main core transistors, with two of the plurality of p-block common-source transistors 320 (B) arranged on one side, and another of the plurality of n-block common-source transistors 316 (A) arranged opposite the first n-block main core transistor 316. In this way, the common-source transistors 316 and 320 of adjacent cores are arranged so that similar transistor types (i.e., n-block or p-block) are arranged adjacent to each other. In another embodiment, the common-source transistors 316 and 320 are arranged on the CMOS transceiver chip 302 in an ABAB pattern. Since the power amplifier block is split in a ABAB or ABBA fashion, there are a substantial number of routes 328 in parallel, further minimizing the L differential 210 and 212 in FIG. 2. Minimizing the L differential 210 and 212 in FIG. 2 improves the gain.

FIGS. 4A-4C depict performance charts of a differential parasitic degeneration inductor. FIGS. 4A-4C relate to the differential parasitic inductance (Ldiff) effect. FIG. 4A depicts the output power at the P1 dB point, FIG. 4B depicts the power added efficiency at the P1 dB point, and FIG. 4C depicts the amplifier gain at the P1 dB point, all versus the carrier frequency. As the differential parasitic inductance to virtual ground increases, the gain of the radio frequency differential power amplifier 200 rapidly decreases, e.g., nearly 1 dB per 10 pico-Henrys, adversely affecting the performance of the radio frequency differential power amplifier 200. This effect is known as the source degeneration effect where the effective transconductance, $Gm_{eff}$, of the transistor core is given by:

$$Gm_{eff} = \frac{Gm}{1 + \omega L \times Gm} \qquad \text{Eq. (1)}$$

FIGS. 5A-5D depict performance charts of a common-mode parasitic degeneration inductor. In particular, FIGS. 5A-5D depict different bias conditions ranging from deep class AB in FIG. 5A (v_curr=0.3) towards medium class AB (i.e., more class A) behavior in FIG. 5D (v_curr=0.6). Each sub-plot exhibits the effect of increasing common mode parasitic inductance (Lcom) on the gain vs. input power.

With reference to Eq. (1), while maintaining a single shared path 216 to ground, the common-mode inductance 214 increases as the number of common-source transistors 202 and 204 implemented in a circuit increases. As the inductance L increases, the effective transconductance, $Gm_{eff}$, decreases. FIG. 5 demonstrates that increasing the inductance creates a strong roll-off mechanism in the effective transconductance, $Gm_{eff}$, or gain. This mechanism can be explained from the class AB operation of a power amplifier. At very low power, a power amplifier acts as a class A amplifier, resulting in a constant gain. As the power increases, the power amplifier enters a class AB mode, at which point, one of the common-source transistors 202 or 204 shuts off, and only the other common-source transistor is conducting. This is called a single-ended period of operation. Thus, at this particular time, the virtual ground does not exist, and one of the common-source transistors 202 or 204 experiences the whole degeneration inductance feedback to ground (i.e., Ldiff and Lcom of FIG. 2). This rapidly decreases the small-signal effective transconductance, $Gm_{eff}$, at this portion of the period. In terms of the entire period, this reduces the "average" effective transconductance, $Gm_{eff}$, or gain. As the power increases, the period of time increases, as well as the roll-off mechanism in the gain.

From Eq. (1) it is shown that as Lcom is increased the small signal $Gm_{eff}$ at the "single-ended" time is decreased. However, above a certain value $Gm_{eff}$ is so low at the "single-ended" time that in terms of the "average" gain over the period, increasing Lcom will have no further effect. This property is confirmed by simulation.

Another effect seen in FIGS. 4 and 5 is as the amplifier is pushed towards deeper class AB operation, a second mechanism tries to compensate for the gain roll-off, seen from the wavy gain vs. pin curve lower v_curr. Getting into deep class AB mode results in a wavy AM-to-AM curve (gain versus input power), as well as an increased AM-to-PM curve. This mechanism evolves from the fact that as the amplifier bias point is lowered the RF input signal in class AB mode has more effect on the effective average bias point, thus resulting in an increase in Gm as the RF input signal is increased. The payoff in doing so, in order to compensate for the Lcom effect, is a reduced small signal gain (or generally reduced gain), as also seen from FIG. 5.

Figure 6:
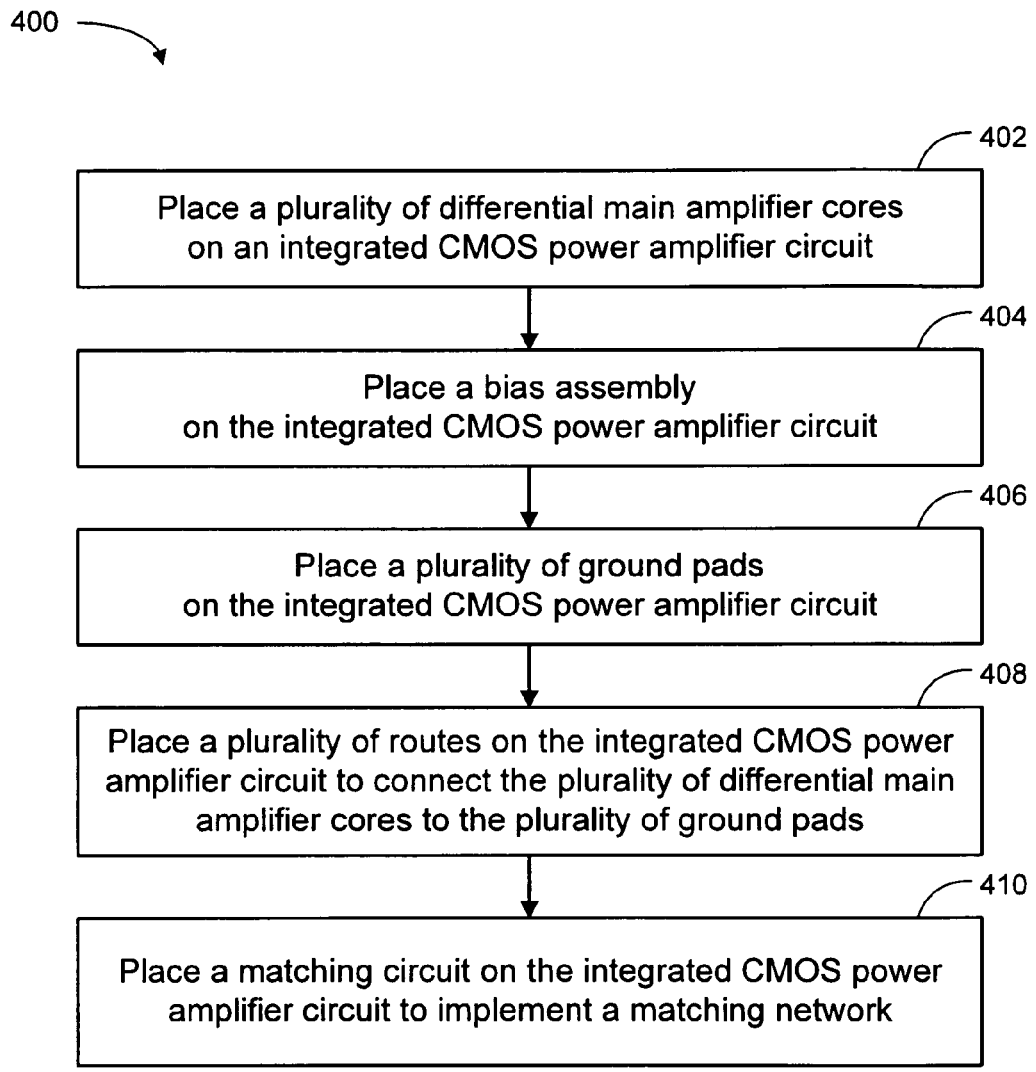
FIG. 6 depicts a schematic flow chart diagram of one embodiment of an improved layout method for use with the improved layout of FIG. 3.

FIG. 6 depicts a schematic flow chart diagram of one embodiment of an improved layout method 600 for use with the improved layout 300 of FIG. 3. Although the improved layout method 600 is described in conjunction with the improved layout 300 of FIG. 3, some embodiments of the method 600 may be implemented with other types of improved layouts.

In the illustrated layout method 600, a plurality of differential main amplifier cores are placed 602 on an integrated CMOS power amplifier circuit. In one embodiment, each differential main amplifier core includes a pair of collocated main amplifier core transistors. In another embodiment, the improved layout method 600 places a plurality of n-block and p-block common-source transistors 116 and 120 on the integrated CMOS power amplifier circuit. In a further embodiment, the improved layout method 600 places each pair of collocated main amplifier core transistors 116 and 120 on the integrated CMOS power amplifier circuit in an alternating pattern.

A bias assembly is then placed 604 on the integrated CMOS power amplifier circuit. In one embodiment, the bias assembly includes a pair of common-gate transistors, such as p-block and n-block common-gate transistors 108 and 112. In one embodiment, each common-gate transistor connects in series to a corresponding one of the collocated main amplifier core transistors.

A plurality of ground pads 306 are then placed 606 on the integrated CMOS power amplifier circuit. In one embodiment, each of the ground pads 306 enables a dedicated connection to ground to a select number, or subset, of the n-block and p-block common-source transistors 316 and 320 included in the integrated CMOS power amplifier 304. In some embodiments, the ground pads 306 connect to a plurality of bond wires. The plurality of bond wires then connect to a ground plane on the CMOS transceiver package 302, connecting the plurality of ground pads 306 to at least one ground plane of the CMOS transceiver package 302.

A plurality of routes are then placed 608 on the integrated CMOS power amplifier circuit to connect the plurality of differential main amplifier cores to the plurality of ground pads 306. In one embodiment, each ground pad 306 is connected to a subset of the differential main amplifier cores. In one embodiment, the improved layout method 600 places each route to independently connect a pair of differential main amplifier cores to a single ground pad, enabling substantially equal route lengths between the pair of differential main amplifier cores connected to the single ground pad 306. In one embodiment, each independent route 326 comprises a short parallel path 328 to each pair of collocated n-block and p-block common-source transistors 116 and 120.

A matching circuit is then placed 610 on the integrated CMOS power amplifier circuit. In one embodiment, the improved layout method 600 places the matching circuit on the integrated CMOS power amplifier circuit to implement a matching network. The matching network matches an output impedance of differential main amplifier core to an input impedance of a load. In one embodiment, the matching circuit includes a shunt inductor 218, a p-block series capacitor 220 coupled to the shunt inductor 218, and an n-block series capacitor 222 coupled to the shunt inductor.

Embodiments of the system and method related to the improved layout of the integrated differential power amplifier 304 described above can have a real and positive impact on increasing the transconductance and amplification and, thus, the performance of the integrated differential power amplifier 304. Additionally, reducing or minimizing the parasitic inductance to virtual ground, as well as the parasitic inductance to the common-mode ground, further improves the power amplifier performance. The minimization of both forms of parasitic inductance, and maximization of transconductance, are achieved with some embodiments of the proposed layout design 300 of the integrated differential power amplifier 304.

Embodiments of certain aspects of the invention can take the form of a computer program product associated with a circuit routing and/or circuit placement system. The computer program product may be accessible from a computer-usable or computer-readable storage medium providing program code for use by or in connection with a computer or any instruction execution system. For the purposes of this description, a computer-usable or computer readable storage medium can be any apparatus that can store the program for use by or in connection with the instruction execution system, apparatus, or device.

Although the operations of the method(s) herein are shown and described in a particular order, the order of the operations of each method may be altered so that certain operations may be performed in an inverse order or so that certain operations may be performed, at least in part, concurrently with other operations. In another embodiment, instructions or sub-operations of distinct operations may be implemented in an intermittent and/or alternating manner.

Although specific embodiments of the invention have been described and illustrated, the invention is not to be limited to the specific forms or arrangements of parts so described and illustrated. The scope of the invention is to be defined by the claims appended hereto and their equivalents.

What is claimed is:

1. An integrated CMOS power amplifier, the integrated CMOS power amplifier comprising:

a plurality of differential main amplifier cores, wherein each differential main amplifier core comprises a pair of collocated main amplifier core transistors;

plurality of ground pads; and a plurality of routes to connect the plurality of differential main amplifier cores to the plurality of ground pads, wherein each ground pad is connected to a subset of the differential main amplifier cores, and the collocated main amplifier core transistors of at least one differential main amplifier core are connected by a shared route to a common ground pad.

2. The integrated CMOS power amplifier of claim 1, wherein each route independently connects a pair of differential main amplifier cores to a single ground pad to enable substantially equal route lengths for the pair of differential main amplifier cores connected to the single ground pad, and wherein each independent route comprises a short parallel path to each pair of collocated main amplifier core transistors.

3. The integrated CMOS power amplifier of claim 1, wherein each pair of collocated main amplifier core transistors comprises:

a p-block common-source transistor; and an n-block common-source transistor.

4. The integrated CMOS power amplifier of claim 3, further comprising a bias assembly comprising a pair of common-gate transistors, each common-gate transistor connected in series to a corresponding one of the collocated main amplifier core transistors.

5. The integrated CMOS power amplifier of claim 4, wherein the common-gate transistors comprise thick-gate transistors.

6. The integrated CMOS power amplifier of claim 3, wherein the collocated main amplifier core transistors comprise thin-gate transistors.

7. The integrated CMOS power amplifier of claim 3, further comprising an alternating placement pattern of each pair of collocated main amplifier core transistors.

8. The integrated CMOS power amplifier of claim 1, further comprising a plurality of bond wires, the plurality of bond wires to connect the plurality of ground pads to a ground plane, wherein the ground plane is located on an integrated transceiver package.

9. The integrated CMOS power amplifier of claim 1, further comprising a matching circuit to implement a matching network to match an output impedance of the differential main amplifier core to an input impedance of a load, the matching circuit comprising:

a shunt inductor;

a p-block series capacitor coupled to the shunt inductor; and an n-block series capacitor coupled to the shunt inductor.

10. An apparatus, the apparatus comprising:

a first pair of differential transistors that are adjacent to each other and to a first ground pad;

a first route to connect the first pair of differential transistors to the first ground pad;

a first pair of common-gate transistors coupled within a bias assembly to the first pair of differential transistors;

a second pair of differential transistors that are adjacent to each other and to a second ground pad;

a second route to connect the second pair of differential transistors to the second ground pad; and a second pair of common-gate transistors coupled within the bias assembly to the second pair of differential transistors.

11. The apparatus of claim 10, wherein the length of the first route substantially equals the length of the second route, and wherein each of the first and second routes comprises a short parallel path to each pair of differential transistors.

12. The apparatus of claim 10, wherein each of the differential transistors comprise a thin-gate transistor.

13. The apparatus of claim 10, wherein each pair of differential transistors comprises:

a p-block common-source transistor; and an n-block common-source transistor.

14. The apparatus of claim 13, wherein each pair of common-gate transistors comprises:

a p-block common-gate transistor, wherein the p-block common-gate transistor is configured to connect in series to one of the p-block common-source transistors; and an n-block common-gate transistor, wherein the n-block common-gate transistor is configured to connect in series to one of the n-block common-source transistors.

15. The apparatus of claim 14, wherein the common-gate transistors comprise thick-gate transistors.

* * * * *